US006999294B2

(12) United States Patent
Festag et al.

(10) Patent No.: US 6,999,294 B2
(45) Date of Patent: Feb. 14, 2006

(54) WAVEGUIDE

(75) Inventors: Mario Festag, Berlin (DE); Daniel Reznik, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 349 days.

(21) Appl. No.: 10/389,610

(22) Filed: Mar. 14, 2003

(65) Prior Publication Data

US 2004/0134683 A1 Jul. 15, 2004

(30) Foreign Application Priority Data

Jan. 15, 2003 (DE) ................................ 103 01 982

(51) Int. Cl.
*H02H 7/20* (2006.01)

(52) U.S. Cl. ....................................... 361/112; 333/248

(58) Field of Classification Search ............... 361/91.1, 361/108, 111, 112, 113, 119; 333/12, 34, 333/245, 246, 248
See application file for complete search history.

(56) References Cited

U.S. PATENT DOCUMENTS

| | | | | |
|---|---|---|---|---|
| 3,626,237 | A * | 12/1971 | Bolton et al. | 313/325 |
| 3,694,911 | A * | 10/1972 | Tomiyason | 29/600 |
| 4,180,843 | A * | 12/1979 | Hagedoorn et al. | 361/119 |
| 4,344,047 | A * | 8/1982 | Dixon, Jr. | 333/17.2 |
| 4,586,105 | A * | 4/1986 | Lippmann et al. | 361/117 |
| 4,642,584 | A * | 2/1987 | Funck et al. | 333/17.2 |
| 4,701,725 | A * | 10/1987 | Dorsey | 333/185 |
| 5,066,928 | A * | 11/1991 | Ikezi et al. | 333/20 |
| 5,656,873 | A * | 8/1997 | O'Loughlin et al. | 307/103 |
| 6,243,247 | B1 * | 6/2001 | Akdag et al. | 361/111 |
| 6,751,081 | B1 * | 6/2004 | Kooiman | 361/119 |
| 6,754,060 | B1 * | 6/2004 | Kauffman | 361/119 |
| 6,771,147 | B1 * | 8/2004 | Mongia | 333/204 |
| 2002/0171992 | A1 * | 11/2002 | Palinkas et al. | 361/119 |
| 2003/0091258 | A1 * | 5/2003 | Uesaka et al. | 385/2 |

FOREIGN PATENT DOCUMENTS

| | | |
|---|---|---|
| DE | 43 29 251 A1 | 3/1995 |
| DE | 195 22 652 C1 | 7/1996 |
| DE | 195 19 724 C1 | 8/1996 |
| JP | 07 050 502 A | 2/1995 |

* cited by examiner

*Primary Examiner*—Ronald Leja
(74) *Attorney, Agent, or Firm*—Laurence A. Greenberg; Werner H. Stemer; Ralph E. Locher

(57) ABSTRACT

A waveguide which is particularly suitable for transmitting electrical signals between or to and/or from electronic circuits, for example between integrated circuits disposed on a printed circuit board, has an over-voltage protection region. The over-voltage region of the waveguide region is specifically formed by the actual geometric configuration of the waveguide.

18 Claims, 2 Drawing Sheets

WAVEGUIDE

BACKGROUND OF THE INVENTION

1. Field of the Invention

The invention relates to an electrical waveguide, in particular to a waveguide for transmitting radio-frequency electrical signals in the MHz and/or GHz range.

SUMMARY OF THE INVENTION

It is accordingly an object of the invention to provide a waveguide that overcomes the above-mentioned disadvantages of the prior art devices of this general type, which is particularly suitable for transmitting electrical signals between or to and/or from electronic circuits—for example between integrated circuits disposed on a printed circuit board.

With the foregoing and other objects in view there is provided, in accordance with the invention, a waveguide. The waveguide contains a waveguide body having an over-voltage protection region formed by a geometric configuration of the waveguide body.

Accordingly, the invention provides for the over-voltage protection region to be present in the waveguide and to be formed by the geometric configuration of the waveguide.

A significant advantage of the waveguide according to the invention is that electrostatic discharge (ESD) problems are avoided in a very simple manner with the waveguide according to the invention. Over-voltages, as may occur as a result of electrostatic charges, for example, are suppressed by the over-voltage protection region in the waveguide according to the invention. The over-voltage protection takes place, according to the invention, in the waveguide, with the result that there is no need for any additional, separate over-voltage protection devices.

A further significant advantage of the waveguide according to the invention is that it is particularly suitable for use in the case of electronic circuits to which high bit-rate data signals are applied. At radio frequencies, conventional over-voltage protection devices formed by separate electrical and electronic components bring about considerable parasitic effects which can no longer be ignored and which lead to the bandwidth of the signals being limited. Such parasitic effects are avoided by the waveguide according to the invention since separate electrical and electronic components are completely dispensed with.

The waveguide may be, for example, a micrometric-wave waveguide and/or a millimeter-wave waveguide. By the terms "micrometer-wave waveguide" and "millimeter-wave waveguide" are meant, in this context, waveguides that are suitable for transmitting electromagnetic waves at wavelengths in the millimeter and micrometer range, respectively, i.e. in the "submeter" range.

The over-voltage protection region may advantageously be formed by the geometric configuration of the individual conductors of the waveguide and/or by the nature of the dielectric between the individual conductors.

The over-voltage protection region in the waveguide may be formed in a particularly simple, and therefore advantageous, manner by the individual conductors being closer together in the over-voltage protection region than in the remaining waveguide region. The smaller spacing in the over-voltage protection region results in a discharge, for example a flashover, between the individual conductors when over-voltages occur. The voltage required to initiate the discharge is determined by the spacing between the individual conductors.

The smaller spacing between the individual conductors may advantageously be due to at least one irregularity disposed in the over-voltage protection region. Since the irregularities are deliberately disposed in the waveguide, it is possible for the over-voltage protection region to be formed in a very simple manner without major complexity and without changing the remaining waveguide geometry.

It is, in principle, possible for any material to be used for providing electrical isolation between the individual conductors in the over-voltage protection region. It is, however, considered to be advantageous if, in the over-voltage protection region, the at least two individual conductors are separated by an air gap, since, when air is used as an insulator, an electrostatic discharge will not cause any damage and will not impair the over-voltage protection region in the case of "triggering" or a flashover. However, a dielectric having a dielectric constant that is smaller than the dielectric constant of a dielectric in the remaining waveguide region may also be used instead of air in the over-voltage protection region.

Coaxial conductors, in particular, are very suitable for transmitting radio-frequency electromagnetic waves. It is therefore considered to be advantageous if the waveguide according to the invention having the over-voltage protection region is formed by a coaxial conductor.

In the case of a coaxial conductor, the over-voltage protection region may be formed in a very simple manner by the outer conductor of the coaxial conductor being conically tapered. The conical tapering of the outer conductor reduces the spacing between the outer conductor and the inner conductor of the coaxial conductor, with the result that a voltage flashover may occur between the outer and the inner conductor at correspondingly high electrical voltages.

In order to avoid significant changes in the characteristic impedance of the coaxial conductor occurring when the outer conductor is conically tapered, it is considered to be advantageous if the inner conductor of the coaxial conductor is also conically tapered in the direction of the over-voltage protection region. Due to the conical tapering of the inner conductor, the characteristic impedance remains largely unchanged when the outer conductor is conically tapered in a corresponding manner, with the result that it is not possible for any undesired electromagnetic reflection to occur in the transition region from the remaining waveguide region to the over-voltage protection region.

Reflections occurring on account of the transition region may be avoided completely in a particularly simple, and therefore advantageous, manner in the case of a coaxial waveguide by the outer conductor and the inner conductor being conically tapered in such a manner that the ratio of the internal diameter of the outer conductor to the external diameter of the inner conductor is the same at any point in the transition region, i.e. is not location-dependent. In the case of a coaxial conductor, the characteristic impedance $Z_L$ may be calculated using the following formula:

$$Z_L = \sqrt{\frac{\mu_0}{\varepsilon_0}} \cdot \frac{\ln\frac{D}{d}}{2\pi\sqrt{\varepsilon_r}}$$

in which D is the external diameter of the coaxial conductor, d is the internal diameter of the coaxial conductor and $\mu_0$, $\epsilon_0$ and $\epsilon_r$ are the material constants. It can be seen from the formula that the characteristic impedance $Z_L$ may be kept constant if the ratio of the external diameter to the internal diameter remains unchanged. Therefore, if the diameter of the outer conductor tapers conically, the diameter of the inner conductor must also taper conically if the characteristic impedance $Z_L$ is to remain unchanged.

In addition to coaxial conductors, coplanar conductors, microstrip waveguides and stripline waveguides are also suitable for transmitting radio-frequency or high bit-rate data signals, with the result that it is considered to be advantageous if the waveguide is a coplanar conductor, a microstrip waveguide or a stripline waveguide.

Coplanar conductors, microstrip waveguides and stripline waveguides are advantageously disposed on substrates, in particular on printed circuit boards, in which the substrate or the printed circuit board is provided with a rear-side ground contact.

When using such printed circuit boards or substrates having a rear-side ground contact, in order to avoid a corresponding interference wave or a corresponding electromagnetic interference pulse being coupled into the waveguide (coplanar conductor, microstrip waveguide or stripline waveguide etc.) or into the dielectric of the substrate when an electrostatic discharge takes place in the over-voltage protection region, provision is made according to one development of the waveguide according to the invention for there to be no rear-side ground contact in the over-voltage protection region, or for the ground contact to be removed in the over-voltage protection region. This is because, if there is no corresponding rear-side ground contact in the over-voltage protection region, then it is more difficult for a corresponding interference wave to be injected.

The over-voltage protection region may advantageously also be formed by a recess in the substrate. The recess is preferably a through-hole that extends through the substrate. The recess should preferably have a metal-free or unmetallized surface.

High-bit-rate data signals are, in particular, also transmitted between electrical and electronic components on a printed circuit board, with the result that it is considered to be advantageous if the waveguide is disposed on a printed circuit board together with at least one electronic component.

When the waveguide is disposed on a printed circuit board together with at least one electronic component, it is considered to be advantageous if the over-voltage protection region in the waveguide is configured such that its response voltage is smaller than the maximum permissible voltage across the electronic component.

The maximum permissible voltage across the electronic component is governed, for example, by the protection class of the respective component.

In this case, the waveguide may advantageously connect at least one input and/or output of the electronic component to at least one input and/or output of a further electronic component disposed on the printed circuit board. Instead of this, it is also possible for the waveguide to connect at least one input and/or output of the electronic component to an input and/or output of the printed circuit board. In this case, the waveguide may have radio-frequency data signals, in particular at frequencies in the MHz and/or in the GHz range applied to it.

The invention also relates to a printed circuit board having at least one waveguide and having at least one over-voltage protection device.

The object of the invention as regards such a printed circuit board having a waveguide is to arrive at a solution which enables electrical signals to be transmitted particularly effectively between or to and/or from electronic circuits—for example between integrated circuits disposed on the printed circuit board.

The object is achieved according to the invention by the over-voltage protection device being formed by an over-voltage protection region in the waveguide.

As regards the advantages of the printed circuit board according to the invention, reference is made to the statements made above in connection with the waveguide according to the invention, since the advantages of the printed circuit board according to the invention correspond to the advantages of the waveguide according to the invention. Specifically, this is because the waveguide according to the invention and the printed circuit board according to the invention are based on the same inventive idea that consists of forming an over-voltage protection region in the waveguide, which ensures the operation of an over-voltage protection device.

Other features which are considered as characteristic for the invention are set forth in the appended claims.

Although the invention is illustrated and described herein as embodied in a waveguide, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
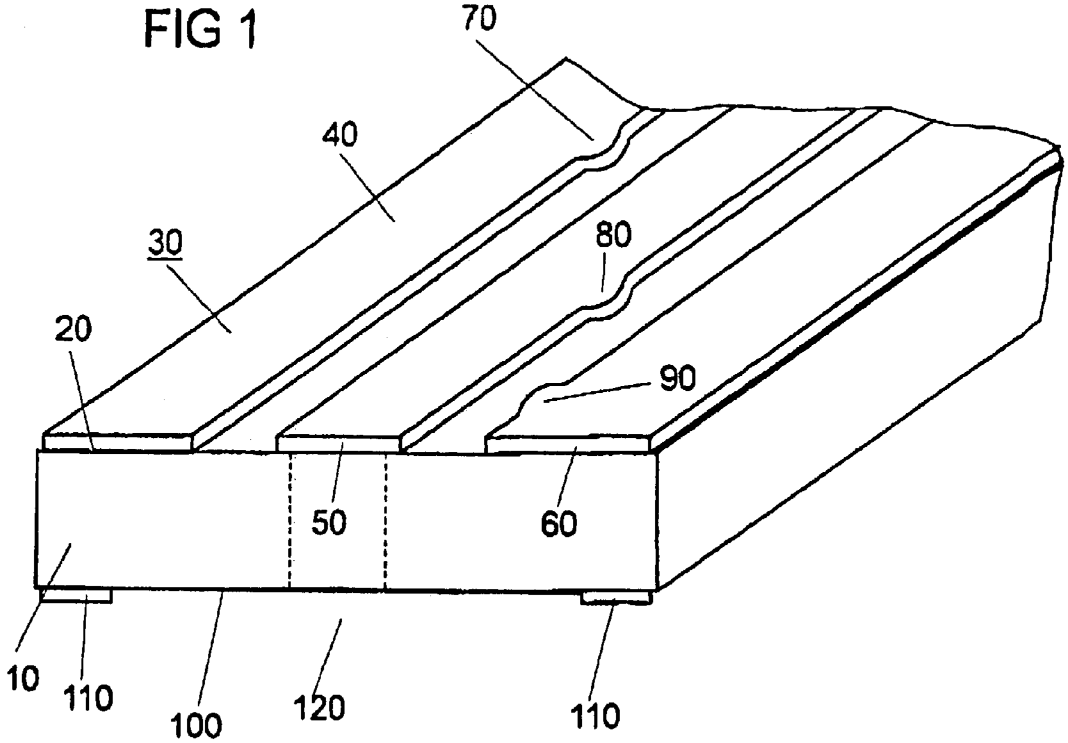
FIG. 1 is a diagrammatic, perspective view of a first exemplary embodiment of a waveguide having a coplanar structure according to the invention.

Referring now to the figures of the drawing in detail and first, particularly, to FIG. 1 thereof, there is shown a substrate 10 which has a coplanar conductor 30 formed on its upper side 20. The coplanar conductor 30 has three individual conductors 40, 50 and 60 that run parallel to one another.

It can be seen from FIG. 1 that there are irregularities 70, 80 and 90 between the individual conductors 40, 50 and 60, which reduce the spacing between the individual conductors 40, 50 and 60. On account of the irregularities 70, 80 and 90, an over-voltage protection region is formed between the individual conductors 40, 50, 60 affected in each case. If a limit voltage or triggering voltage (response voltage) defined by the spacing between the individual conductors in the region of the irregularities 70, 80 and 90 is exceeded, sparks will flash over at the irregularities 70, 80 and 90, resulting in an electrical or electrostatic discharge.

In the case of the coplanar conductor 30, the discharge will occur only in the region of the irregularities 70, 80 and 90, since it is only there that the spacing between the individual conductors 40, 50, 60 is sufficiently small. In the remaining waveguide region, no flashover will occur—due to the greater spacing between the individual conductors—since the triggering voltage that is necessary for this to happen is not reached. If the voltage across the coplanar conductor 30 increases, then the triggering voltage in the region of the irregularities will, for the time being, be exceeded, which will result in a flashover at this point. The voltage is thus prevented from increasing further. It is thus no longer possible for the higher "triggering voltage" that is necessary for a flashover to occur in the remaining waveguide region to be reached.

This ensures that the remaining waveguide region of the coplanar conductor 30 and thus the electronic components that may be connected to the coplanar conductor 30 are effectively protected from an over-voltage that is greater than the triggering voltage in the region of the irregularities.

Finally, it can be seen from FIG. 1 that a rear-side ground conductor 110 is provided on a rear side 100 of the substrate 10. In the region of the irregularities 70, 80 and 90, the rear-side ground conductor 110 has window-shaped openings 120. The openings 120 prevent an electromagnetic interference pulse from being injected into the coplanar conductor 30 or into the dielectric of the substrate 10 when a spark discharge occurs in the region of the irregularities 70, 80 and 90.

Figure 2:
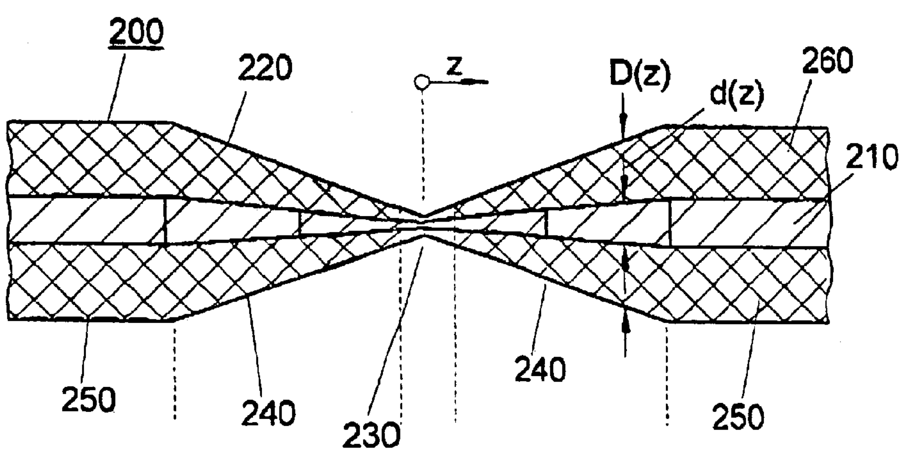
FIG. 2 is a sectional view of a second exemplary embodiment of a waveguide which is formed by a coaxial conductor.

A second exemplary embodiment of the waveguide according to the invention is shown in FIG. 2. The waveguide in this instance is a coaxial conductor 200 that is formed by an inner conductor 210 and an outer conductor 220.

The coaxial conductor 200 has three waveguide regions in FIG. 2, namely an over-voltage protection region 230, adjoining transition regions 240 and remaining waveguide regions 250 which adjoin the transition regions.

In the transition regions 240 and in the remaining waveguide regions 250, the inner conductor 210 and the outer conductor 220 are separated from one another by a plastic insulation 260. In the region of the over-voltage protection region 230, the outer conductor 220 and the inner conductor 210 are separated from one another by air.

In the transition regions 240, the inner conductor 210 and the outer conductor 220 each taper in the direction of the over-voltage protection region 230. An external diameter d(z) of the inner conductor 210 and an internal diameter D(z) of the outer conductor 220 are thus location-dependent, as indicated by the locational coordinate "z" in FIG. 2. A characteristic impedance $Z_L$ is thus likewise location-dependent, and is dependent on the locational variable z. The characteristic impedance is given by:

$$Z_L(z) = \sqrt{\frac{\mu_0}{\varepsilon_0}} \cdot \frac{\ln\frac{D(z)}{d(z)}}{2\pi\sqrt{\varepsilon_r}}$$

In the exemplary embodiment according to FIG. 2, the inner conductor 210 and the outer conductor 220 taper such that the ratio D(z)/d(z) remains constant independently of the point in the transition region 240—i.e. independently of location. As a result, the characteristic impedance $Z_L$ is independent of location in the transition region 240 and corresponds to the characteristic impedance in the remaining waveguide region 250.

Since the diameters of the inner conductor 210 and the outer conductor 220 are appropriately dimensioned, it is not possible for the electromagnetic waves that are transmitted via the coaxial conductor 200 to be reflected (to any significant extent) in the transition region 240, since the characteristic impedance $Z_L$ is not altered.

It should undoubtedly be remembered that the characteristic impedance $Z_L$ is likewise altered to a certain extent due to the "material change" between the over-voltage protection region 230—filled with air—and the two transition regions 240—filled, for example, with the plastic insulation 260 in this case. In order to prevent or reduce reflections occurring as a result of the sudden material change, it is possible for the ratio D/d at the transition points between the materials to be varied to a correspondingly minor extent in order to compensate for the change in refractive index. In the case of coaxial conductors in which air is used as the insulator (with reinforcing rods for holding the inner conductor) instead of plastic insulation, the problem of the change in refractive index does not, of course, exist.

If an over-voltage should then occur in the coaxial conductor 200, an electrostatic flashover will occur since there is only a short distance between the inner conductor 210 and the outer conductor 220 in the over-voltage protection region 230, and the flashover will have the effect of limiting the voltage. In the case of the coaxial conductor 200 shown in FIG. 2, only air is provided as the insulator instead of the plastic insulation 260 in the over-voltage protection region 230. It is thus not possible for the material to be damaged as a result of a flashover in the over-voltage protection region 230, as would be the case, for example, if the plastic insulation 260 were also provided in the region of the over-voltage protection region 230. This is because a flashover or an electrostatic discharge in the region of the plastic insulation 260 would lead to the plastic material being destroyed, with the result that the coaxial conductor 200 would be damaged after the occurrence of an over-voltage. Such damage to the coaxial conductor is advantageously avoided by air in the over-voltage protection region 230.

Figure 3:
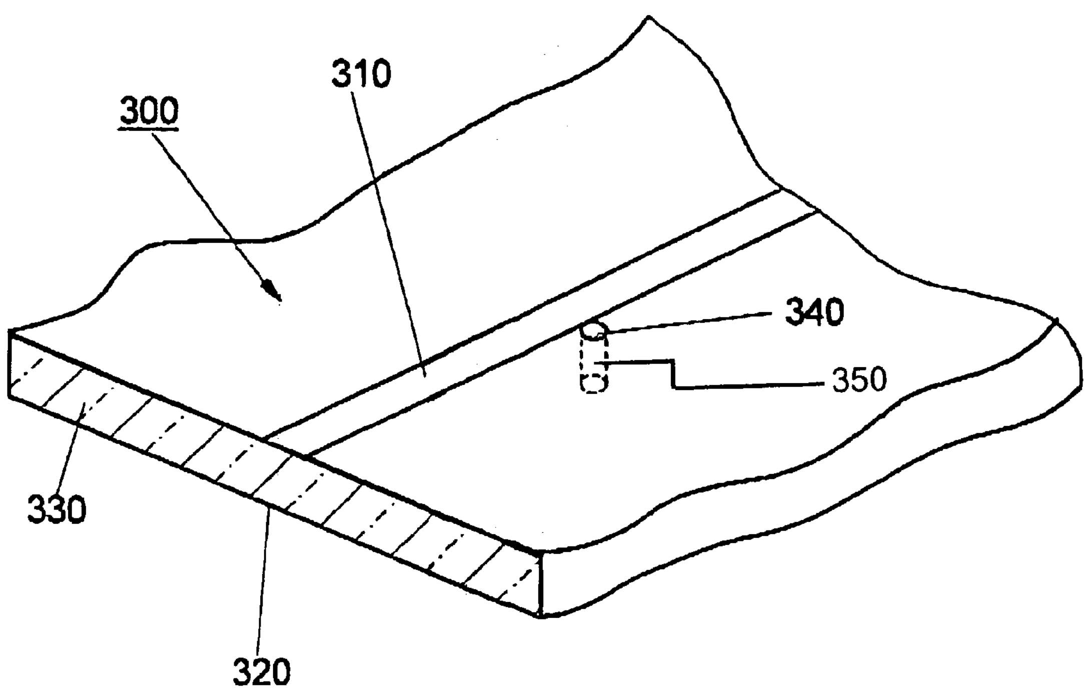
FIG. 3 is a perspective view of a third exemplary embodiment of a waveguide that is formed by a microstrip waveguide.

FIG. 3 shows a microstrip waveguide that is formed by a strip-typed individual conductor 310 and a metallized rear side 320 of a substrate 330.

The over-voltage protection region is formed, in the case of the exemplary embodiment according to FIG. 3, by the geometric configuration of the dielectric—i.e. of the substrate region. Specifically, a through-hole 340, for example a drilled-hole or an etched hole, is provided in the immediate vicinity of the individual conductor 310 in the substrate 330 and forms an air channel between the upper side of the substrate 330 and the metallized rear side 320 of the substrate 330. The diameter of the through-hole 340 may be very small, preferably smaller than 1 mm.

If the voltage then rises above a limit voltage determined by the spacing between the individual conductor 310 and the through-hole 340, then a spark discharge or a flashover results in the air channel formed by the through-hole 340.

The through-hole 340 need not necessarily be filled with air. It is also feasible for a dielectric 350 to be provided in the through-hole 340. In this case, a dielectric constant of the dielectric 350 should preferably be smaller than a dielectric constant of a dielectric in the remaining waveguide region. The outer surface or the inside of the through-hole 340 should preferably not be metallized so that it is possible for a gas discharge to form in the through-hole 340. If the hole

340 were metallized, the path provided for gas discharge would be short-circuited, as a result of which the striking voltage would be markedly reduced since, in this case, the spark gap would be formed only indirectly between the upper end of the through-hole 340 and the individual conductor 310.

Instead of the through-hole 340, it is also possible for a recess, formed in the substrate 330, to be provided on the surface, i.e. a hole that does not extend right through the substrate 330.

Instead of a microstrip waveguide, it is also possible, for example, for a stripline waveguide to be disposed on the substrate 330. The configuration shown in FIG. 3 would operate in a corresponding fashion in the case of a stripline waveguide.

We claim:

1. A waveguide, comprising:

a substrate;

a waveguide body disposed on said substrate, said waveguide body being selected from the group consisting of a coplanar conductor, a microstrip waveguide, and a stripline waveguide, and said waveguide having an over-voltage protection region formed by a geometric configuration of said waveguide body;

a rear-side ground contact disposed on said substrate, said rear-side ground contact not extending into said over-voltage protection region.

2. The waveguide according to claim 1, wherein said waveguide body has a remaining waveguide region and individual conductors with regions of said individual conductors disposed closer together to each other in said over-voltage protection region than in said remaining waveguide region.

3. The waveguide according to claim 2, wherein said individual conductors have at least one irregularity defining a smaller spacing between said individual conductors and said irregularity is disposed in said over-voltage protection region.

4. The waveguide according to claim 2, wherein said individual conductors in said over-voltage protection region are separated by an air gap.

5. The waveguide according to claim 1, further comprising:

at least one electronic component; and a printed circuit board, said waveguide body is disposed on said printed circuit board together with said at least one electronic component.

6. The waveguide according to claim 5, wherein said over-voltage protection region is configured such that its response voltage is smaller than a maximum permissible voltage across said electronic component.

7. The waveguade according to claim 6. wherein the maximum permissible voltage across said electronic component is governed by a protection class of said electronic component.

8. The waveguide according to claim 5, further comprising a further electronic component disposed on said printed circuit board and having inputs and outputs, said electronic component has inputs and outputs, said waveguide body connects at least one of said inputs and said outputs of said electronic component to at least one of said inputs and said outputs of said further electronic component.

9. The waveguide according to claim 5, wherein said printed circuit board and said electronic component each have inputs and outputs, and said waveguide body connects at least one of said inputs and said outputs of said electronic component to at least one of said inputs and said outputs of said printed circuit board.

10. The waveguide according to claim 1, wherein the waveguide has radio-frequency data signals applied to it.

11. The waveguide according to claim 1, wherein the waveguide has radio-frequency data signals applied it having frequencies in at least one of a MHz range and a GHz range.

12. A waveguide, comprising:

a waveguide body being a coaxial conductor having an over-voltage protection region formed by a geometric configuration of said waveguide body, a remaining waveguide region, and a transition region, and said coaxial conductor having an outer conductor conically tapered in said transition region from said remaining waveguide region into said over-voltage protection region.

13. The waveguide according to claim 12, wherein said coaxial conductor has an inner conductor conically tapered in said transition region from said remaining waveguide region to said over-voltage protection region.

14. The waveguide according to claim 13, wherein said outer conductor and said inner conductor are conically tapered such that a ratio of an internal diameter of said outer conductor to an external diameter of said inner conductor is equivalent at any point in said transition region.

15. A waveguide, comprising:

a waveguide body selected from the group consisting of a coplanar conductor, a microstrip waveguide, and a stripline waveguide and said waveguide body having an over-voltage protection region formed by a geometric configuration of said waveguide body;

a substrate having a recess formed therein and said over-voltage protection region being formed by said recess, said waveguide body disposed on said substrate; and a rear-side ground contact disposed on said substrate.

16. The waveguide according to claim 15, wherein said recess forms a through-hole through said substrate.

17. The waveguide according to claim 16, further comprising a first dielectric having a dielectric constant filling said through hole, said substrate formed of a second dielectric having a dielectric constant greater than said first dielectric.

18. The waveguide according to claim 15, wherein said recess has a metal-free or unmetallized surface.

* * * * *